United States Patent [19]

Shakuda

[11] Patent Number: 5,521,396

[45] Date of Patent: May 28, 1996

[54] SEMICONDUCTOR LIGHT EMITTING DEVICE

[75] Inventor: Yukio Shakuda, Kyoto, Japan

[73] Assignee: Rohm Co., Ltd., Kyoto, Japan

[21] Appl. No.: 258,681

[22] Filed: Jun. 13, 1994

[30] Foreign Application Priority Data

Jun. 14, 1993 [JP] Japan ..................... 5-142224

[51] Int. Cl.$^6$ .................. H01L 29/06; H01L 31/0328; H01L 31/0336; H01L 31/072

[52] U.S. Cl. ................. 257/15; 257/21; 257/22

[58] Field of Search ............... 257/15, 21, 22, 257/190, 200

[56] References Cited

U.S. PATENT DOCUMENTS

| | | | |
|---|---|---|---|
| 4,695,857 | 9/1987 | Baba et al. | 257/190 |
| 4,792,832 | 12/1988 | Baba et al. | 257/190 |
| 5,262,660 | 11/1993 | Streit et al. | 257/190 |
| 5,319,219 | 6/1994 | Cheng et al. | 257/15 |
| 5,338,947 | 8/1994 | Watanabe | 257/15 |

OTHER PUBLICATIONS

Tan et al, "High–Pwr V–Band . . . HEMT", *IEEE Elec. Dev. Lttrs,*, vol. 12 No. 5, pp. 213–214, May 91.

*Primary Examiner*—Stephen D. Meier
*Attorney, Agent, or Firm*—Nikaido, Marmelstein, Murray & Oram

[57] ABSTRACT

In a light emitting device made of a group II–VI semiconductor of ZnCdSSe or MgZnCdSSe, to facilitate the movement of electrons or holes from a GaAs substrate to a group II–VI semiconductor film and to flow the current at a low voltage, a ZnSe—AlGaAs super lattice layer is formed between the group II–VI semiconductor film and the GaAs substrate so that the energy band from the substrate to the group II–VI semiconductor film rises in steps or gradually. In an device where an N-type semiconductor layer of the group II–VI semiconductor film is arranged on the side of the substrate, a P-type semiconductor film which raises the energy band from the electrode to the P-type semiconductor layer in steps is formed between the electrode and the P-type semiconductor layer which is the top layer of the group II–VI semiconductor film.

14 Claims, 11 Drawing Sheets

Fig. 2
Prior Art
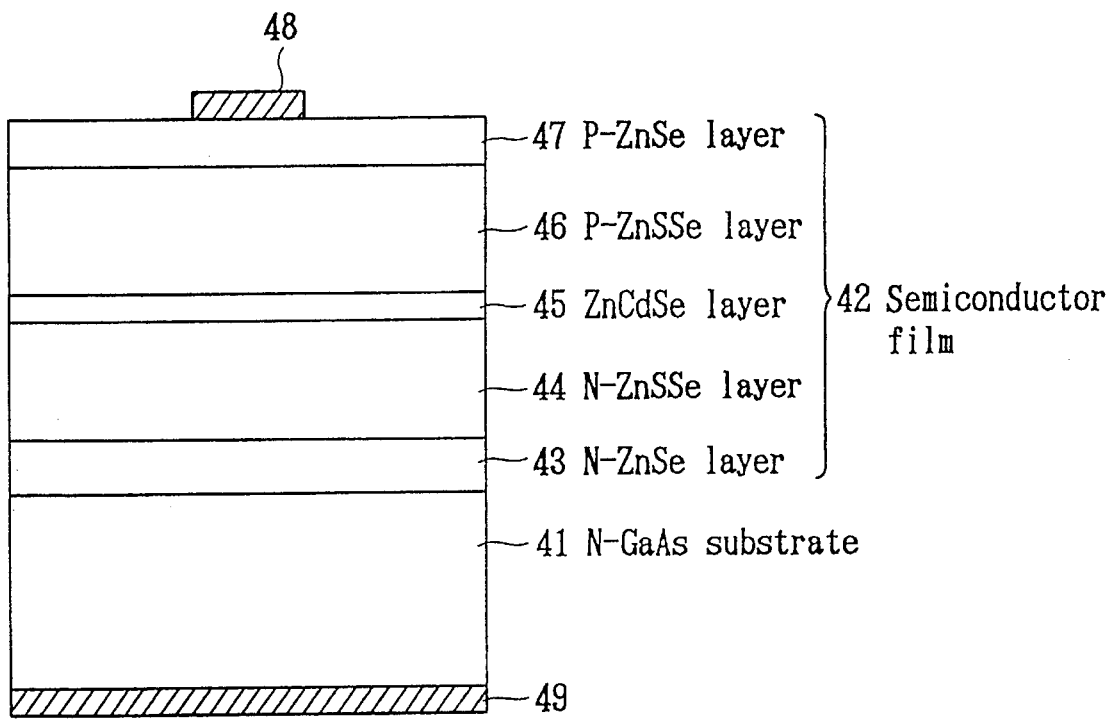
Fig. 3
Prior Art
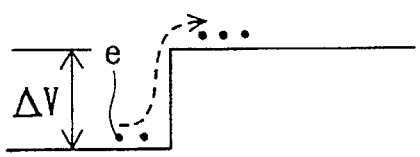
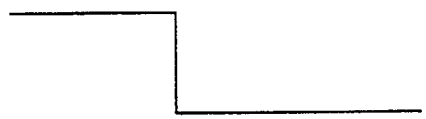

4: Group II-VI semiconductor film
12: N-type semiconductor layer
13: P-type semiconductor layer
14: Group III-V semiconductor layer 24 : Group II-VI semiconductor film
32 : P-type semiconductor layer
33 : N-type semiconductor layer
34 : Group III-V semiconductor layer

SEMICONDUCTOR LIGHT EMITTING DEVICE

BACKGROUND OF THE INVENTION

1. Field of the Invention

The present invention relates to a semiconductor light emitting device used as a semiconductor laser device, as a blue light emitter which is one of the elements of a display panel for use in displays of various electronic apparatuses, as a blue light emitting device (LED) used individually in a display apparatus, as a signal reading and writing light emitting device for use in a compact disk (CD) player and a laser disk (LD) player, and as a light emitting device for use in a bar code reader.

2. Description of the Prior Art

FIG. 1 schematically shows the basic structure of such a semiconductor light emitting device and the condition of a corresponding energy band. The general structure of the semiconductor light emitting device is as follows: a semiconductor film B of a P-N junction structure is formed on the surface of an N-type semiconductor substrate by MBE (molecular beam epitaxy)-growing an N-type semiconductor layer $B_1$, an active layer $B_2$ and a P-type semiconductor layer $B_a$ in this order, and metal electrodes $E_1$ and $E_2$ are formed on the N-type substrate A and on the P-type semiconductor layer $B_3$ which is the top layer of the semiconductor film.

As well known, the energy band of the semiconductor device of the above-described structure is of a configuration such that the energy levels of the N-type semiconductor film $B_1$ and the P-type semiconductor layer $B_3$ are high and an energy level trough is formed at the active layer $B_2$ which is a P-N junction. Consequently, when a bias voltage is applied between the electrodes $E_2$ and $E_1$ in a forward direction, the carriers, i.e. holes h and electrons e injected by the voltage application recombine by being shut up in the active layer $B_2$ where the energy level is low, so that natural light is emitted therefrom. In a semiconductor laser, when the exciting current exceeds a threshold value, light resonates between the parallel end surfaces of the active layer $B_2$ to cause a laser oscillation.

Conventionally, in manufacturing a semiconductor light emitting device which emits blue light, the semiconductor film B is formed by epitaxially growing a group II-VI semiconductor of ZnCdSSe or MgZnCdSSe directly on a GaAs substrate A, or through a group III-V film grown on the GaAs substrate A and having the same conductivity as that of the GaAs substrate A.

FIG. 2 shows a conventional semiconductor light emitting device. The conventional device shown in the figure is what is called a blue light emitting semiconductor laser of ZnSe in which a group II-VI semiconductor film 42 of ZnCdSSe or MgZnCdSSe is formed on an N-type GaAs substrate 41.

The group II-VI semiconductor film 42 is formed by MBE-growing an N-type ZnSe layer 43 which is a buffer layer, an N-type ZnSSe layer 44 which is a clad layer, a ZnCdSe layer 45 which is an active layer 45, a P-type ZnSSe layer 46 which is a clad layer and a P-type ZnSe layer 47 which is a buffer layer in this order on the substrate 41. On the P-type ZnSe layer 47 which is the top layer of the group II-VI semiconductor film, a metal such as Au is directly deposited to form an electrode 48. Reference numeral 49 represents an electrode formed on the reverse surface of the substrate 41.

In the semiconductor device of the above-described conventional structure, as is obvious from the energy band configuration shown in FIG. 3, there is a considerably large energy band gap between the N-type GaAs substrate 41 made of a group III-V semiconductor and the N-type ZnSe layer 43 of a group II-VI semiconductor film 42. As a result, a barrier potential $\Delta V$ is generated. The broken arrows in FIGS. 1 and 3 show the flows of electrons e.

Since a considerably high voltage must be applied between the electrodes 48 and 49 to obtain a current which causes the electrons e to go over the barrier potential $\Delta V$, not only the power required to drive the device increases but also amperes of currents flow in the device. Since the current density in the device is very high, it is inevitable that the device generates heat while being driven.

Such problems can be similarly caused when a P-type GaAs substrate is used. In this case, it is necessary to apply between the electrodes a voltage required to obtain a current which causes holes h to go over the potential barrier between the P-type GaAs substrate and the II-VI semiconductor film. The problems of the power consumption and the heat generation when the device is driven are caused like in the case where the N-type GaAs substrate is used.

Moreover, in a structure where a group III-V semiconductor film of the same conductivity as that of the GaAs substrate is grown on the GaAs substrate, since there is a band gap between the group III-V semiconductor film and the group II-VI semiconductor film, the same problems are caused.

SUMMARY OF THE INVENTION

An object of the present invention is to reduce the power consumption and the heat generation and to improve the temperature characteristic of the whole semiconductor light emitting device by reducing the barrier potential between the group III-V semiconductor film and the group II-VI semiconductor film to improve the voltage/current characteristic so that a necessary current flows at a low voltage.

A semiconductor light emitting device of the present invention is directed to a structure in which a semiconductor film of a P-N junction structure where an N-type semiconductor layer and a P-type semiconductor layer are arranged in lamination with an active layer between is grown directly on a GaAs substrate or on a group III-V semiconductor film grown on the GaAs substrate and having the same conductivity type as that of the GaAs substrate, and an electrode is formed on each of the obverse surface of the semiconductor film and the reverse surface of the GaAs substrate.

To achieve the above-mentioned object, according to the present invention, the semiconductor film is made of a group II-VI semiconductor of ZnCdSSe or MgZnCdSSe, and between the group II-VI semiconductor film and the GaAs substrate or the group III-V semiconductor film, a ZnSe—AlGaAs super lattice layer is provided made of ZnSe and AlGaAs having the same conductivity type as that of the GaAs substrate.

In this structure, the group III-V semiconductor film is formed by growing an AlGaAs film on the GaAs substrate. The ZnSe—AlGaAs super lattice layer is formed by alternately growing ZnSe and AlGaAs in lamination at a constant film thickness ratio or by alternately growing them in lamination while continuously varying the film thickness ratio so that a ZnSe film closer to the group II-VI semiconductor film is thicker and that an AlGaAs film closer to the GaAs substrate or the group III–V semiconductor film is thicker.

In this structure, the energy level of the ZnSe—AlGaAs super lattice layer is intermediate between those of the GaAs substrate or the group III–V semiconductor film, and the group II–VI semiconductor film. Generally, the quantity of current flowing through a P-N junction structure formed between a positive and a negative electrodes decreases exponentially with respect to the height of the energy barrier.

The current flows more easily in a structure where there is an intermediate energy level than in a structure like the conventional structure where there is a single large energy barrier between the GaAs substrate or the group III–V semiconductor film, and the group II–VI semiconductor film. Therefore, even though the potential differences of the energy barriers are the same, the voltage necessary to obtain a current which causes the electrons or the holes to go over the energy barrier between the GaAs substrate or the group III–V semiconductor film and the group II–VI semiconductor film is largely reduced compared to the conventional structure.

The super lattice layer formed by alternately growing ZnSe and AlGaAs in lamination at a constant film thickness ratio provides an intermediate band gap between the GaAs substrate or the group III–V semiconductor film, and the group II–VI semiconductor film. Since the energy band from the GaAs substrate to the group II–VI semiconductor film takes a form where small potential barriers are present in steps, the band gap decreases, so that the current flows more easily both in the structure using an N-type substrate and the structure using a P-type substrate.

In the structure having a super lattice layer formed by alternately growing ZnSe and AlGaAs in lamination while varying the film thickness ratio so that a ZnSe film closer to the group II–VI semiconductor film is thicker and that an AlGaAs film closer to the GaAs substrate or the group III–V semiconductor film is thicker, the energy band continuously changes between the GaAs substrate or the group III–V semiconductor film, and the group II–VI semiconductor film. Since there are hardly any band gaps therebetween, the current flows much more easily.

In addition to these structures, in an device where the group II–VI semiconductor film is formed on an N-type GaAs substrate or on a group III–V N-type semiconductor film grown on a GaAs substrate, between the P-type semiconductor layer and the electrode, either of a P-type GaAs film and a P-type InGaAs film having an energy level intermediate between those of the P-type semiconductor layer and the electrode is formed, or both of them are formed in this order in lamination. Alternately, a P-type AlGaAs film and a P-type GaAs film are formed in lamination in this order.

With this structure, the energy levels of the layers are higher in the following order: the electrode<the P-type InGaAs film<the P-type GaAs film<the P-type AlGaAs film<the group II–VI semiconductor film. Therefore, in any structure having any of these P-type films, the energy band from the electrode to the group II–VI semiconductor film takes a form where there are stepwise level differences. Further, since the Schottky-type energy barrier is also reduced, even though the potential differences of the energy barriers are the same, the voltage necessary to obtain a current which causes the holes or the electrons to go over the energy barrier between the electrode and the P-type semiconductor layer is largely reduced compared to the conventional structure.

BRIEF DESCRIPTION OF THE DRAWINGS

This and other objects and features of this invention will become clear from the following description, taken in conjunction with the preferred embodiments with reference to the accompanied drawings in which:

FIG. 2 is a cross-sectional view schematically showing the structure of the conventional semiconductor laser;

FIG. 3 is a characteristic diagram schematically showing the condition of the energy band between the group III–V substrate and the group II–VI P-N junction layer in the conventional device;

DESCRIPTION OF THE PREFERRED EMBODIMENTS

Figure 1:
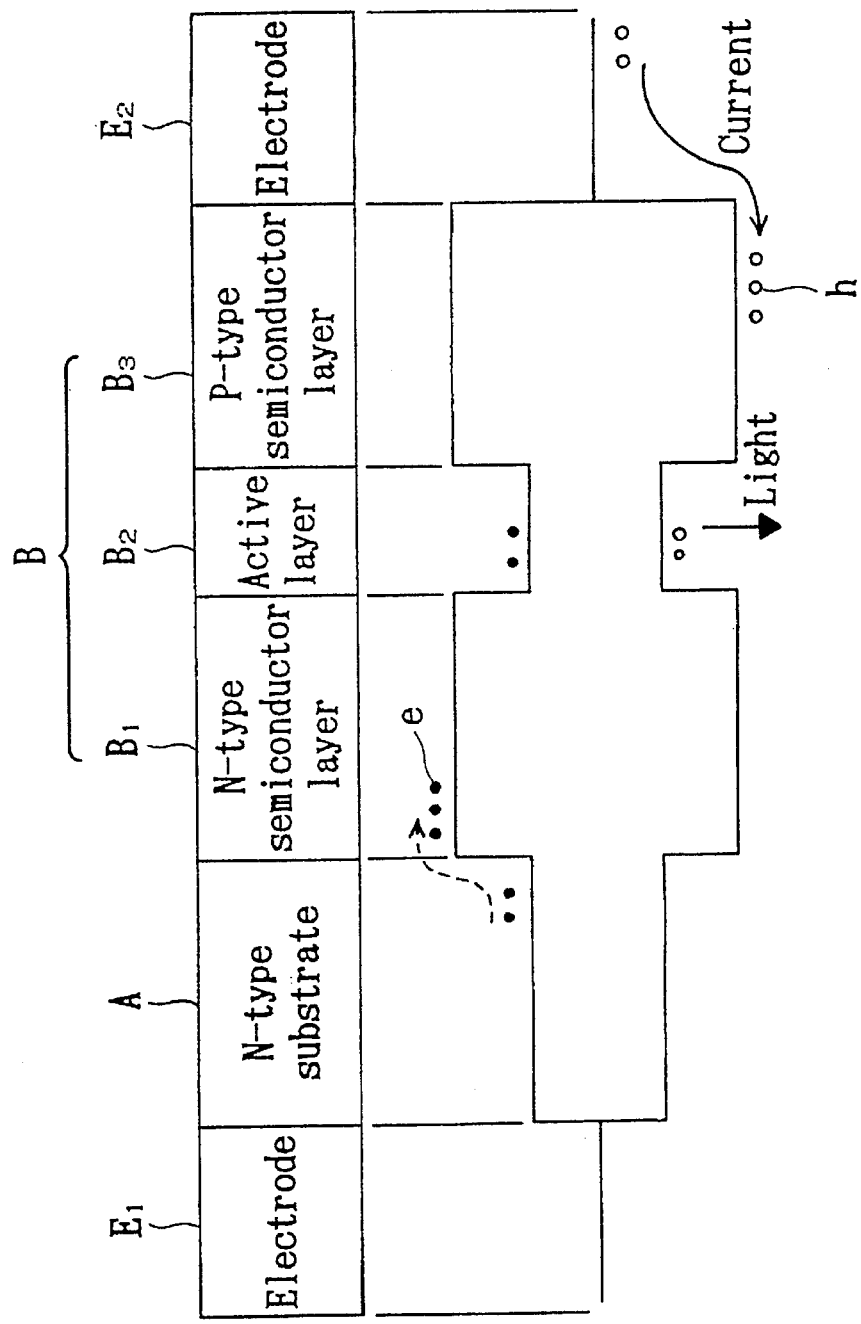
FIG. 1 schematically shows the structure of a conventional semiconductor laser and the condition of a corresponding energy band.
Figure 4:
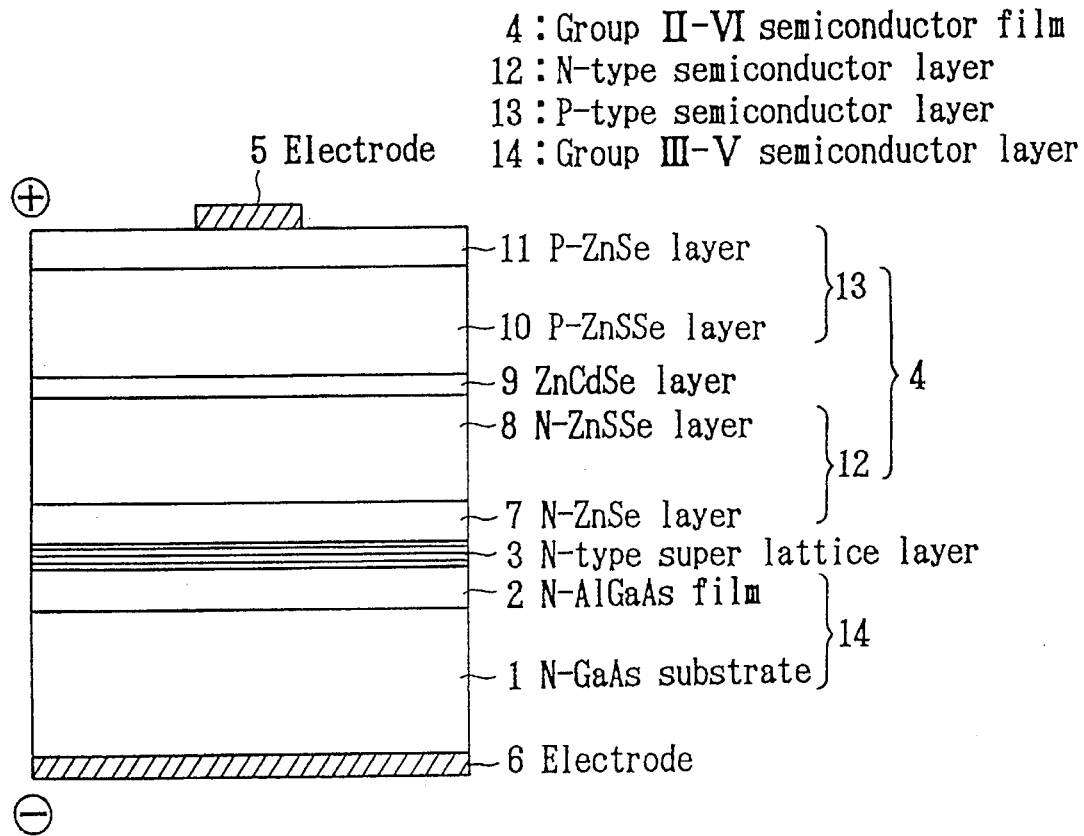
FIG. 4 is a cross-sectional view schematically showing the structure of a first embodiment of the present invention.

Hereinafter, embodiments where the present invention is employed for a semiconductor laser device will be described with reference to the drawings. FIGS. 4 to 8 show a first embodiment of the present invention. FIG. 4 is a cross-sectional view schematically showing the first embodiment. The device shown in the figure is a blue light emitting semiconductor laser in which an N-type AlGaAs film 2, an N-type ZnSe—AlGaAs super lattice layer 3 and a group II–VI semiconductor film 4 of ZnCdSSe which will be described later are grown on an N-type GaAs substrate 1, and counter electrodes 5 and 6 made of a metal such as Au are respectively formed on the obverse surface of the II–VI semiconductor film 4 and on the reverse surface of the N-type GaAs substrate 1.

In this embodiment, the electrode 6 is formed on the entire surface of the GaAs substrate 1, whereas the electrode 5 on the group II–VI semiconductor film 4 is of a belt shape having a constant width. The belt-shaped electrode 5 is advantageous since the current diffusion is prevented and the current effectively contributes to the light emission. However, the configuration of the electrode in this embodiment is not limited thereto.

The group II–VI semiconductor film 4 formed by MBE-growing an N-type ZnSe layer 7 which is a buffer layer, an N-type ZnSSe layer 8 which is a clad layer, a ZnCdSe layer 9, a P-type ZnSSe layer 10 which is a clad layer and a P-type ZnSe layer 11 which is a buffer layer in this order is of a P-N junction structure where the ZnCdSe layer 9 which is an active layer is sandwiched between an N-type semiconductor layer 12 including the N-type ZnSe layer 7 and the N-type ZnSSe layer 8, and a P-type semiconductor layer 13 including the P-type ZnSSe layer 10 and the P-type ZnSe layer 11.

Figure 5:
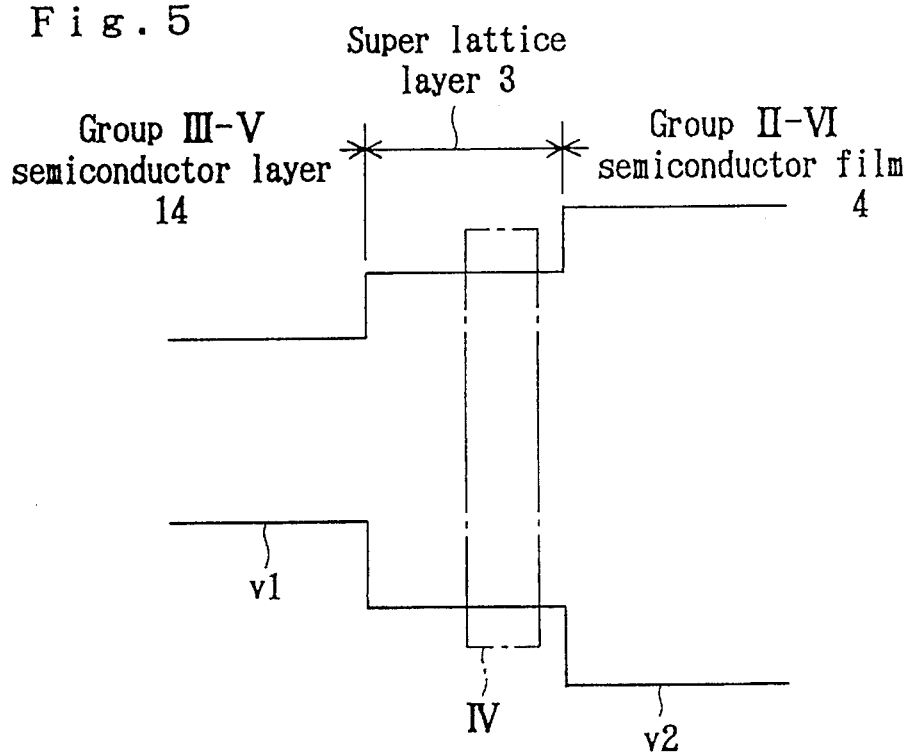
FIG. 5 is a characteristic diagram schematically showing the condition of the energy band between the group III–V semiconductor layer and the group II–VI semiconductor film in the first embodiment.

Since the N-type GaAs substrate 1 and the N-type AlGaAs film 2 grown on the substrate 1 are both made of a group III–V semiconductor, the lamination structure including the N-type GaAs substrate 1 and the N-type AlGaAs film 2 will hereinafter be referred to as a group III–V N-type semiconductor layer 14. FIG. 5 schematically shows the energy band between the group III–V N-type semiconductor layer 14 and the group II–VI semiconductor film 4. As shown in the figure, there is a significant energy gap between the III–V N-type semiconductor layer 14 and the group II–VI semiconductor film 4. In this embodiment, the previously-mentioned N-type ZnSe—AlGaAs super lattice layer 3 is provided between the layer 14 and the film 4 to divide the energy gap.

Figure 6:
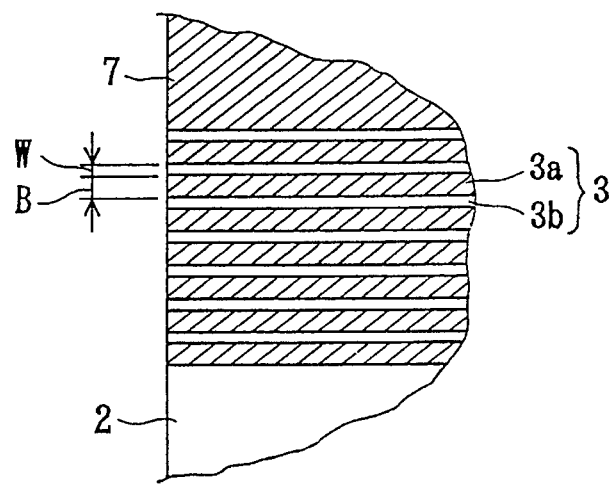
FIG. 6 is a partly enlarged view schematically showing the N-type super lattice layer of the first embodiment.

FIG. 6 schematically shows the structure of the N-type ZnSe—AlGaAs super lattice layer 3. The N-type super lattice layer 3 is formed by alternately growing N-type ZnSe films and N-type AlGaAs films, which are extremely thin such that the interatomic distance is used as the reference unit. In this embodiment, the ratio of the film thickness B of the N-type ZnSe film 3a to the film thickness W of the N-type AlGaAs film 3b (B:W) is constant for all the layers of the super lattice layer 3. In FIG. 6, the hatched portions represent the N-type ZnSe films, while the blank portions represent the N-type AlGaAs films.

Figure 7:
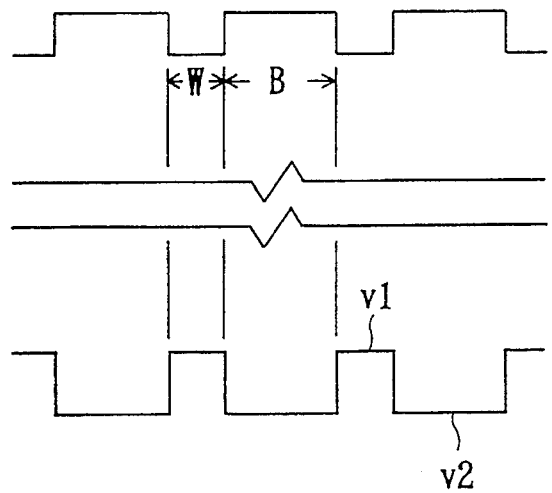
FIG. 7 is a partly enlarged diagram schematically showing the IV portion of FIG. 5.

FIG. 7 is an enlarged view of the IV portion of FIG. 5. In the figure, v1 represents the energy level of the group III–V N-type semiconductor layer 14, and v2 represents the energy level of the II–VI semiconductor film 4. Microscopically, the energy level of the N-type super lattice layer 3 at the portions corresponding to an N-type ZnSe film 3a is the same as the energy level v2 of the group II–VI semiconductor film 4, and the energy level at the portions corresponding to an N-type AlGaAs film 3b is the same as the energy level v1 of the III–V N-type semiconductor layer 14.

However, macroscopically, the energy level of the N-type super lattice layer 3 functions as the intermediate level between the energy levels of the group III–V N-type semiconductor layer 14 and the group II–VI semiconductor film 4 as shown in FIG. 5 since the energy levels v1 and v2 are leveled by the film thicknesses.

Further, since the N-type super lattice layer 3 is provided between the group III–V N-type semiconductor layer 14 and the group II–VI semiconductor film 4, the level difference in the energy band structure between the group III–V N-type semiconductor layer 14 and the group II–VI semiconductor film 4 is stepwise because of the presence of the intermediate band gap formed by the N-type super lattice layer 3. Consequently, the barrier potential is divided into two steps to reduce the band gap.

In this structure, when a bias voltage is applied between the electrodes 5 and 6 in a forward direction, i.e. from the electrode 5 to the electrode 6, the current flows from the electrode 5 to the group II–VI semiconductor film 4. The holes h are caused by this current to go over the energy barrier between the electrode 5 and the group II–VI semiconductor film 4 to flow from the P-type semiconductor layer 13 to the ZnCdSe layer 9 which is an active layer. Similarly, the electrons e pass through the N-type GaAs substrate 1, the N-type AlGaAs film 2 and the N-type super lattice layer 3 and flow from the N-type semiconductor layer 12 into the ZnCdSe layer 9.

By the injection of the carriers, the recombination occurs of the electrons e and the holes h which are shut up in the ZnCdSe layer 9 where the energy level is low, so that natural light is emitted from the ZnCdSe layer 9. When the exciting current exceeds a threshold value, the light emission of the ZnCdSe layer 9 is changed from the natural light emission to an induced emission, so that light resonates between the parallel end surfaces of the ZnCdSe layer 9 to cause a laser oscillation.

Figure 8:
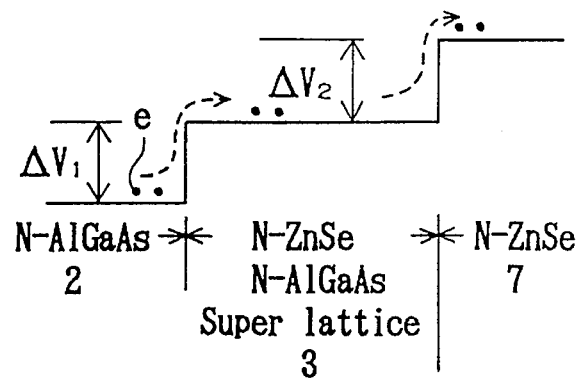
FIG. 8 schematically shows the manner in which electrons go over the energy gap in the first embodiment.

FIG. 8 schematically shows the manner in which the electrons e go over the energy gap existing between the group III–V N-type semiconductor layer 14 and the group II–VI semiconductor film 4. In this figure, the broken arrows show the flows of the electrons e. When the barrier potential between the N-type AlGaAs layer 2 and the N-type super lattice layer 3 is $\Delta V_1$ and the barrier potential between the N-type super lattice layer 3 and the N-type ZnSe layer 7 is $\Delta V_2$, the sum of $\Delta V_1$ and $\Delta V_2$ is substantially equal to the potential difference $\Delta V$ between the group III–V substrate 41 and the group II–VI semiconductor film 42 of the conventional structure shown in FIG. 3. However, the quantity of currents flowing through the P-N junction structure between the electrodes 5 and 6 decreases exponentially with respect to the height of the energy barrier.

Since the current flows easily if the energy band is divided into two steps by the N-type super lattice layer 3 like in this embodiment, even though the potential differences of the energy gaps are the same, the voltage necessary to obtain a current to cause the electrons e to go over the barrier potential between the group III–V N-type semiconductor layer 14 and the group II–VI semiconductor film 4 can be largely reduced compared to the conventional structure.

Subsequently, an example of a process for manufacturing a semiconductor laser device of the above-described structure will be described. First, the N-type AlGaAs layer 2 is MBE-grown on the N-type GaAs substrate 1 whose substrate temperature is set at a predetermined temperature of 350° C. or below, and the N-type ZnSe—AlGaAs super lattice layer 3 is formed on the N-type AlGaAs layer 2. Then, the N-type ZnSe layer 7, the N-type ZnSSe layer 8, the ZnCdSe layer 9, the P-type ZnSSe layer 10 and the P-type ZnSe layer 11 are MBE-grown in lamination on the N-type ZnSe—AlGaAs super lattice layer 3 to form the group II–VI semiconductor film 4 of ZnCdSSe.

A metal such as Au serving as an electrode is deposited onto the P-type ZnSe layer 1 thus formed, and unnecessary portions are removed by a method such as etching, so that the electrode 5 is formed in a belt shape. The electrode 6 is formed on the entire reverse surface of the N-type GaAs substrate 1 in a similar manner.

While the group II–VI semiconductor film 4 is made of a group II–VI semiconductor of ZnCdSSe in the above-described embodiment, the same workings and advantages are obtained when the semiconductor film 4 is made of a group II–VI semiconductor of MgZnCdSSe. While the N-type super lattice layer 3 is grown on the N-type AlGaAs layer 2 which is grown on the N-type GaAs substrate 1, the N-type super lattice layer 3 may be grown directly on the N-type GaAs substrate 1.

Figure 9:
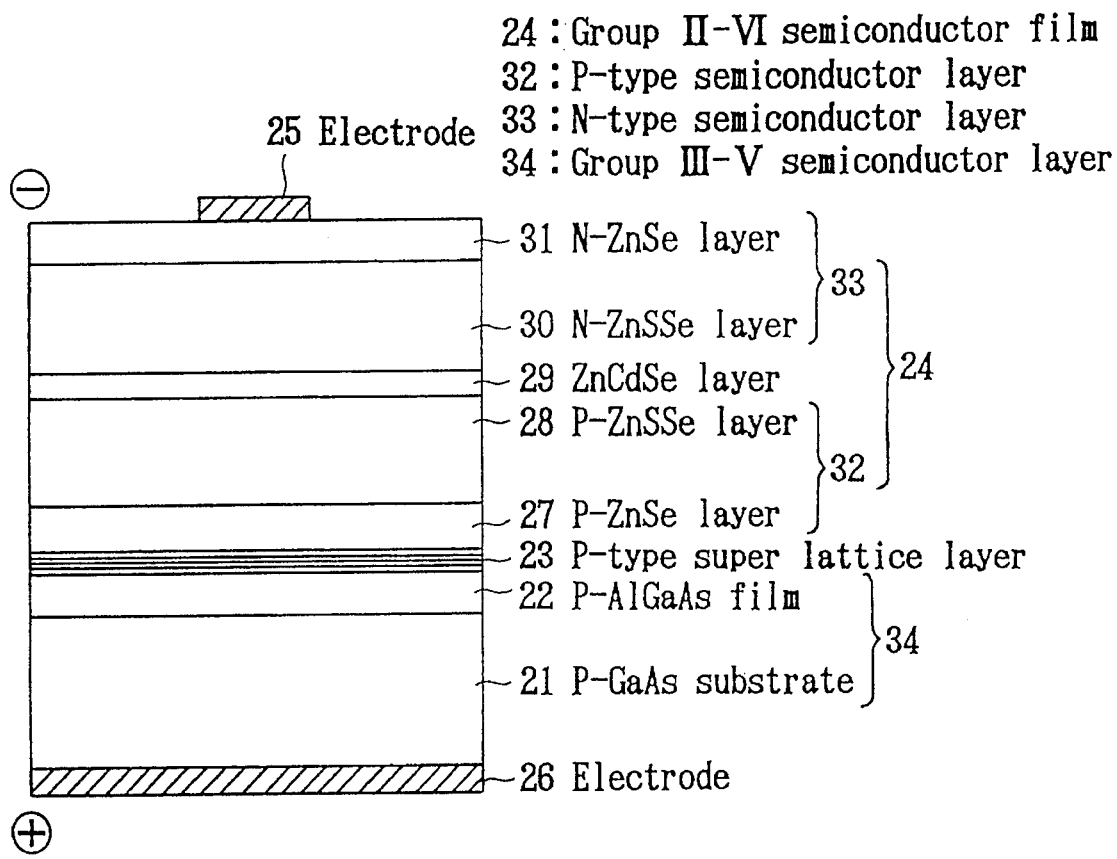
FIG. 9 is a cross-sectional view schematically showing the structure of a second embodiment of the present invention.

FIGS. 9 to 13 show a second embodiment of the present invention. In the semiconductor laser device according to this embodiment shown in these figures, a P-N junction structure is grown on a P-type GaAs substrate 21. Specifically, as shown in FIG. 9, a P-type AlGaAs film 22 is grown on a P-type GaAs substrate 21, and after a P-type ZnSe—AlGaAs super lattice layer 23 is formed on the P-type AlGaAs film 22, a group II–VI semiconductor film 24 of ZnCdSSe is formed. Then, counter electrodes 25 and 26 made of a metal such as Au are respectively formed on the obverse surface of the group II–VI semiconductor film 24 and on the reverse surface of the P-type GaAs substrate 21.

The group II–VI semiconductor film 22 is formed by MBE-growing a P-type ZnSe layer 27 which is a buffer layer, a P-type ZnSSe layer 28 which is a clad layer, a ZnCdSe layer 29, an N-type ZnSSe layer 30 which is a clad layer and an N-type ZnSe layer 31 which is a buffer layer in this order. Like the group II–VI semiconductor film of the first embodiment, the ZnCdSe layer 29 which is an active layer is inserted at the P-N junction.

Figure 10:
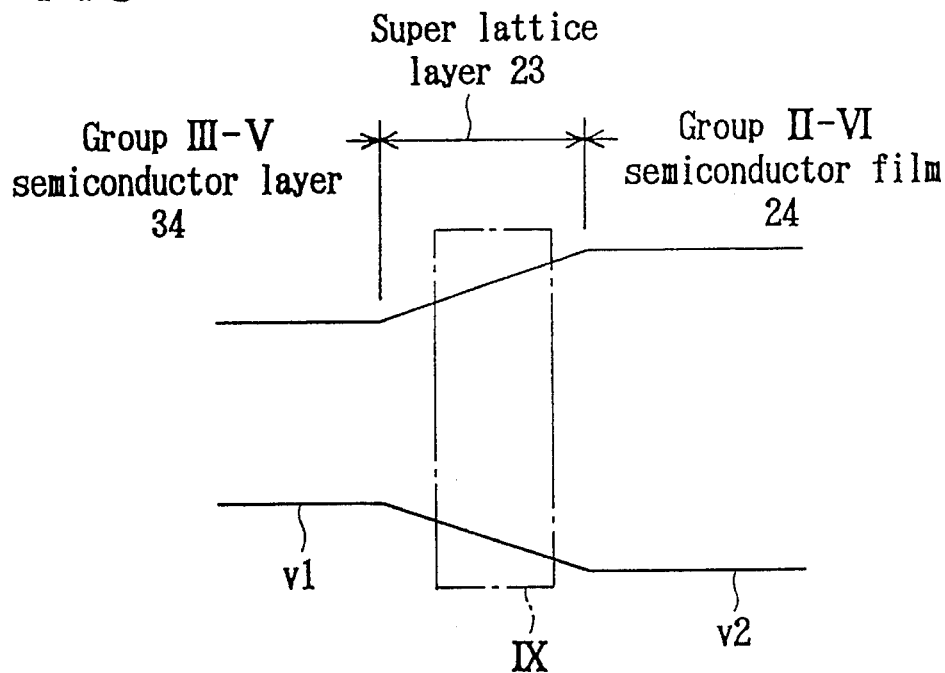
FIG. 10 is a characteristic diagram schematically showing the condition of the energy band between the group III–V semiconductor layer and the group II–VI semiconductor film in the second embodiment.

FIG. 10 schematically shows the condition of the energy band between a group III–V P-type semiconductor film 34 including the P-type GaAs substrate 21 and the P-type AlGaAs film 2, and the group II–VI semiconductor film 24. As shown in the figure, the previously-mentioned P-type ZnSe—AlGaAs super lattice layer 23 is arranged between the group III–V P-type semiconductor layer 34 and the group II–VI semiconductor film 24.

Figure 11:
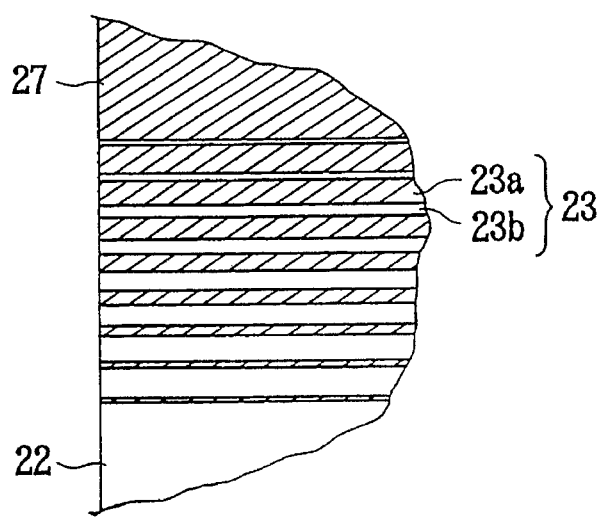
FIG. 11 is a partly enlarged view schematically showing the P-type super lattice layer of the second embodiment.

FIG. 11 schematically shows the structure of the P-type ZnSe—AlGaAs super lattice layer 23. Like the super lattice layer 3 of the first embodiment, the P-type super lattice layer 23 is formed by growing extremely thin films of P-type ZnSe and P-type AlGaAs alternately in lamination. In this embodiment, the film thickness ratio is continuously varied so that a P-type ZnSe film 23a closer to the group II–VI semiconductor film 24 is thicker and that a P-type AlGaAs film 23b closer to the group III–V semiconductor film 34 is thicker. In FIG. 11, the hatched portions represent the P-type ZnSe films, whereas the blank portions represent the P-type AlGaAs films.

Figure 12:
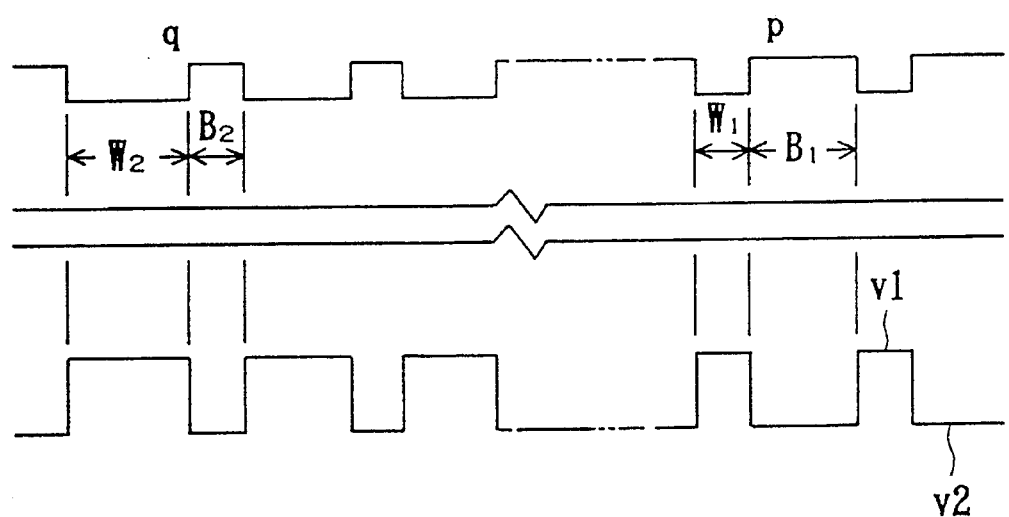
FIG. 12 is a partly enlarged diagram schematically showing the IX portion of FIG. 10.

FIG. 12 is an enlarged view of the IX portion of FIG. 10. In the figure, v1 represents the energy level of the group III–V P-type semiconductor layer 34 and v2 represents the energy level of the group II–VI semiconductor film 24. As shown in the figure, microscopically, the energy level of the P-type super lattice layer 23 is the same as the energy level v2 of the group II–VI semiconductor layer 34 at portions corresponding to the P-type ZnSe film 23a and the same as the energy level v1 of the group II-V P-type semiconductor film 34 at portions corresponding to the P-type AlGaAs film 23b.

In this case, at a point p in the P-type super lattice layer 23 which is close to the group II–VI semiconductor film 24, a thickness $B_1$ of the P-type ZnSe film 23a is larger than a thickness $W_1$ of the P-type AlGaAs film 23b. At a point q in the P-type super lattice layer 34 which is close to the group III–V semiconductor layer 34, a thickness $W_2$ of the P-type AlGaAs film 23b is larger than a thickness $B_2$ of the P-type ZnSe film 23a. Because of the continuous variation in film thickness ratio of the films 23a and 23b, the energy band of the P-type super lattice layer 23 is, macroscopically, of an inclining pattern connecting the energy bands of both layers as shown in FIG. 10.

Further, since the P-type super lattice layer 23 is located between the group II-V P-type semiconductor layer 34 and the group II–VI semiconductor layer 24, there is no band gap in the energy band structure from the group III–V P-type semiconductor layer 34 to the group II–VI semiconductor film 24 due to the presence of the P-type super lattice layer 3 therebetween.

In the above-described structure, the voltage is applied in a forward direction from the electrode 26 on the side of the P-type GaAs substrate 21 to the electrode 25 on the side of the N-type ZnSe layer 31. While the voltage is being applied, the current flows from the P-type GaAs substrate 21 to the group II–VI semiconductor film 24, and this current causes the holes h to go over the energy barrier between the group III–V P-type semiconductor layer 34 and the group II–VI semiconductor film 24 to flow from a P-type semiconductor layer 32 into the ZnCdSe layer 29. Similarly, the electrons e flow from an N-type semiconductor layer 33 into the ZnCdSe layer 9.

Figure 13:
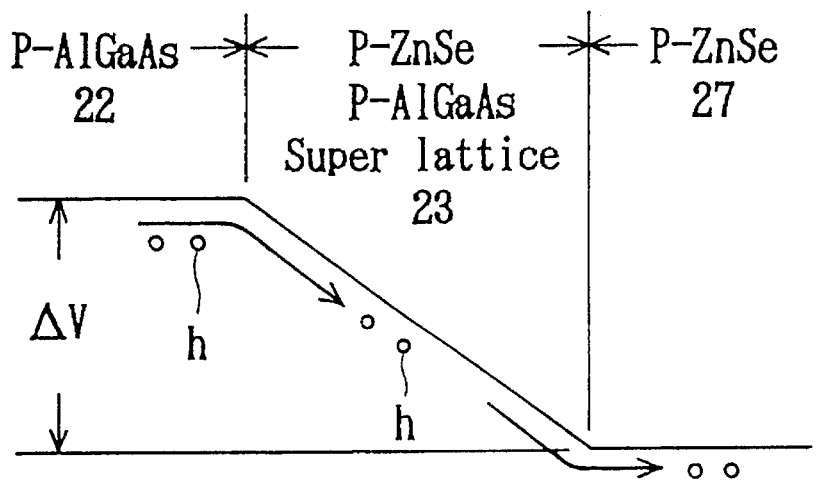
FIG. 13 schematically shows the manner in which holes go over the energy gap in the second embodiment.

FIG. 13 schematically shows the manner in which the holes h go over the energy gap between the group III–V semiconductor layer 34 and the group II–VI semiconductor film 24. In this figure, the solid arrow represents the flow of the holes h. Since the band pattern of the P-type super lattice layer 23 causes no barrier potential at the potential difference ΔV between the P-type AlGaAs layer 22 and the P-type ZnSe layer 27 as shown in the figure, the voltage can be reduced which is necessary to obtain a current which causes the holes h to go over the barrier potential ΔV between the group II-V P-type semiconductor layer 34 and the group II–VI semiconductor film 24.

The structures of super lattice layer 3 of the first embodiment and the super lattice layer 23 of the second embodiment are different in that the film thickness ratios between the ZnSe film and the AlGaAs film are different. However, either super lattice layer may be employed by accommodating the conductivity type to each device.

In the device of the first embodiment, the metal electrode 5 is directly formed on the P-type ZnSe layer 11 as shown in FIG. 4. However, it is known that when the P-type semiconductor of ZnSe is in direct contact with a metal, a Schottky-type voltage/current characteristic is caused between the layer 11 and the electrode 5.

Figure 14:
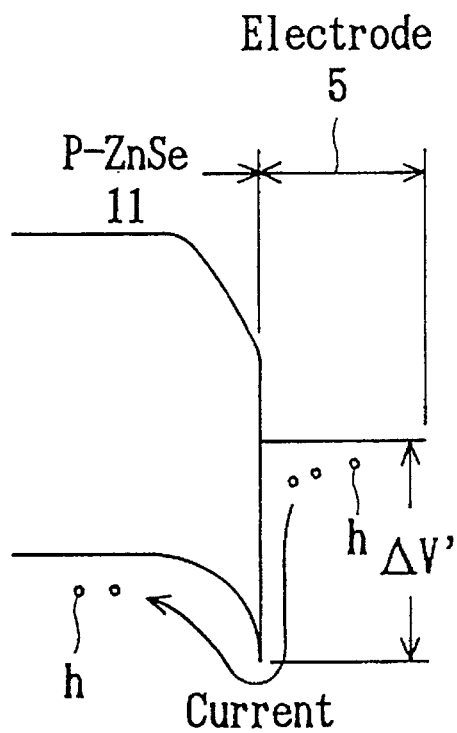
FIG. 14 is a characteristic diagram schematically showing the condition of the energy band between the electrode and the group II–VI semiconductor film.

That is, as is obvious from the energy band structure shown in FIG. 14, when a bias is applied in a forward direction between the electrode 5 and 6, a steep Schottky-type energy barrier ΔV' is generated between the metal electrode 5 and the P-type ZnSe layer 11 forming the obverse surface of the group II–VI semiconductor film 4.

For this reason, the current which causes the holes h to go over the energy barrier ΔV' cannot be obtained unless a considerable high voltage is applied.

Figure 15:
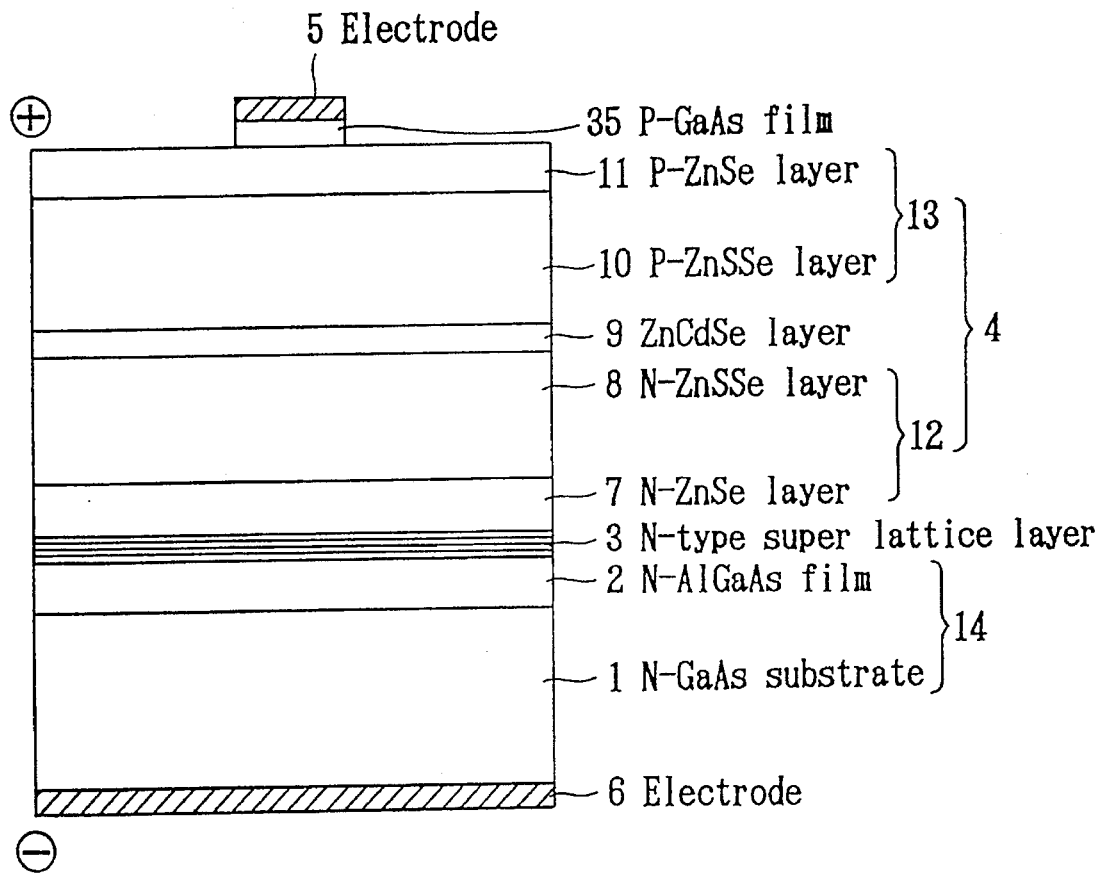
FIG. 15 is a cross-sectional view schematically showing the structure of a third embodiment of the present invention.
Figure 16:
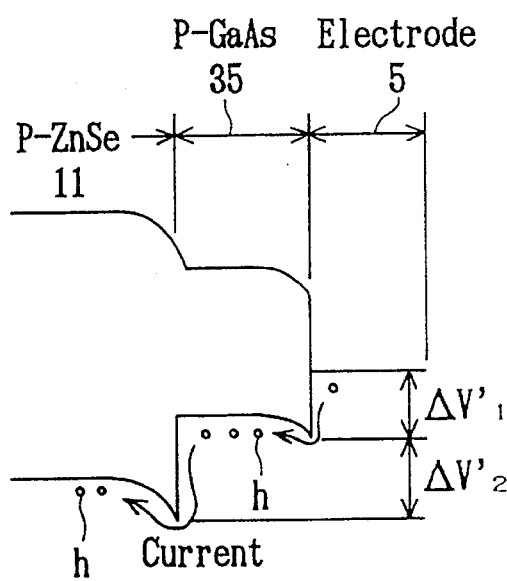
FIG. 16 schematically shows the manner in which holes go over the energy gap in the third embodiment.
Figure 17:
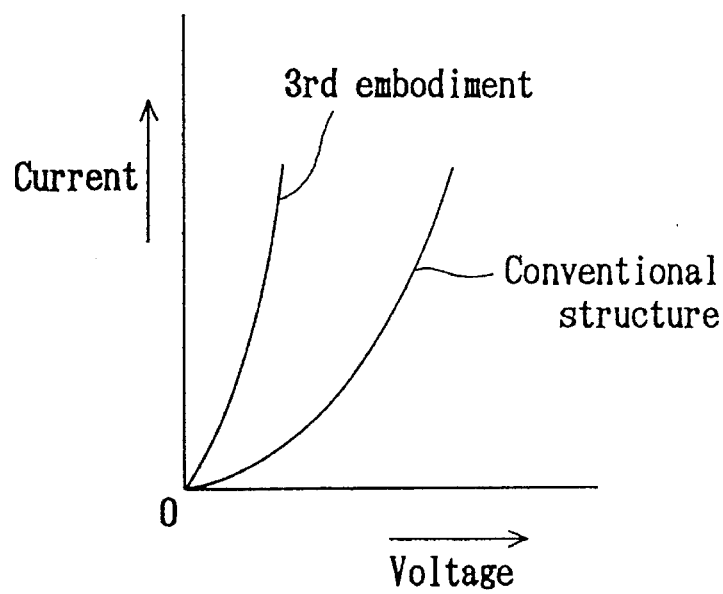
FIG. 17 diagrammatically shows the voltage/current characteristics of the third embodiment and the conventional device for comparison.

FIGS. 15 to 17 show a third embodiment of the present invention, which is intended to solve this problem. Portions having the same structures and workings as those of the first embodiment are identified by the same reference designations and are not described. In this embodiment, a P-type interface film is formed between the electrode 5 and the group II–VI semiconductor film 4. Specifically, on the P-type ZnSe layer 11 which is the top layer of the group II–VI semiconductor film 4, a P-type GaAs film 35 having an energy band lower than that of the P-type ZnSe layer 11 is formed through MBE growth, and on the P-type GaAs film 35, a metal such as Au is deposited to form the electrode 5.

In this structure, when a bias is applied between the electrodes 5 and 6 in a forward direction, the current flows to the group II–VI semiconductor film 4 by way of the electrode 5 and the P-type GaAs film 35, and this current causes the holes h to go over the energy barrier between the electrode 5 and the P-type ZnSe layer 11 to flow from the P-type semiconductor layer 13 into the ZnCdSe layer 9 which is an active layer.

FIG. 16 shows the energy band from the electrode 5 to the P-type ZnSe layer 11 in this embodiment. As shown in the figure, the energy levels of the layers are higher in the following order: the electrode 5<the P-type GaAs film 35<the P-type ZnSe layer 11. Therefore, the energy barrier from the electrode 5 to the P-type ZnSe layer 11 is divided into two steps $\Delta V_1'$ and $\Delta V_2'$ because of the presence of the P-type GaAs film 35 therebetween.

The sum of $\Delta V_1'$ and $\Delta V_2'$ is substantially equal to the potential difference ΔV' between the electrode 5 and the P-type ZnSe layer 11 of the first embodiment shown in FIG. 14. Since the quantity of current flowing through the P-N junction structure between the electrodes 5 and 6 decreases exponentially with respect to the height of the energy barrier also in this case, the voltage necessary to obtain the current which causes the holes h to go over the energy barrier between the electrode 5 and the P-type ZnSe layer 11 can largely be reduced. In addition, since the Schottky-type energy barrier is reduced, the necessary voltage is further reduced.

FIG. 17 shows the voltage/current characteristics of this embodiment and the conventional structure. As is obvious from this figure, in this embodiment, even though the potential differences of the energy barriers are the same, the necessary current is obtained at a low voltage compared to the conventional structure.

According to this embodiment, the device is operated at an even lower voltage due to this feature in addition to the fact that the electrons easily go over the potential barrier by the presence of the N-type super lattice layer 3 between the group III–V N-type semiconductor layer 14 and the group II–VI semiconductor film 4.

The same workings and advantages are obtained when instead of the P-type GaAs film 35, a P-type InGaAs film having an energy barrier intermediate between those of the P-type ZnSe layer 11 and the metal electrode 6 like the P-type GaAS film 35 is used as the P-type interface film.

Figure 18:
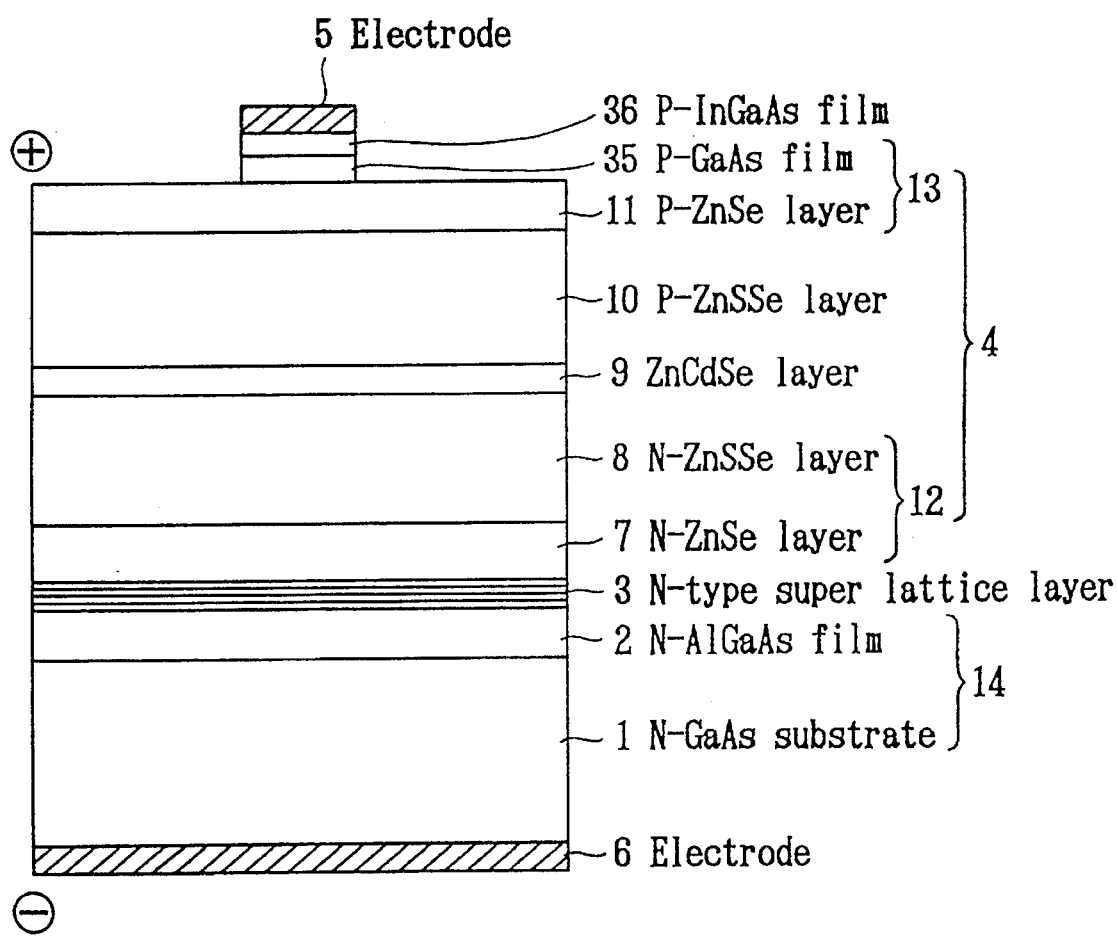
FIG. 18 is a cross-sectional view schematically showing the structure of a fourth embodiment of the present invention.
Figure 19:
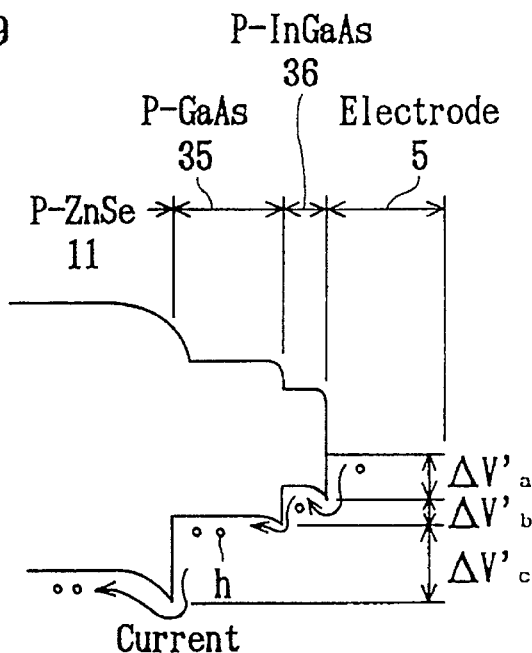
FIG. 19 schematically shows the manner in which holes go over the energy gap in the fourth embodiment.

FIGS. 18 and 19 show a fourth embodiment of the present invention. Portions having the same structures and workings as those of the first and third embodiments are identified by the same reference designations and are not described. In this embodiment, the P-type GaAs film 35 which is MBE-grown is formed on the P-type ZnSe layer 11 which is the top layer of the group II–VI semiconductor film 4, and the P-type InGaAs film 36 which is MBE-grown is formed on the P-type GaAs film 35. On the P-type InGaAs film 36, a metal such as Au is deposited to form the electrode 5. Thus, the P-type interface film is of two-layer structure.

In this structure, when a bias voltage is applied between the electrodes 5 and 6 in a forward direction, the current flows by way of the electrode 5, the P-type InGaAs film 36 and the P-type GaAs film 35 into the group II–VI semiconductor film 4, and this current causes the holes h to go over the energy barrier between the electrode 5 and the group II–VI semiconductor film 4 to flow from the P-type semiconductor layer 13 to the ZnCdSe layer 9 which is an active layer.

FIG. 19 shows the energy band from the electrode 5 to the P-type ZnSe layer 11 in this embodiment. As shown in this figure, the energy levels of the layers are higher in the following order: the electrode 5<the P-type InGaAs film 36<the P-type GaAs film 35<the P-type ZnSe layer 11. Therefore, the energy barrier from the electrode 5 to the P-type ZnSe layer 11 is divided into three steps, i.e. into potential differences $\Delta Va'$, $\Delta Vb'$ and $\Delta Vc'$ because of the presence of the P-type InGaAs film 36 and the P-type GaAs film 35 therebetween. As a result, the current flows more easily than in the above-described third embodiment.

The sum of the potential differences $\Delta Va'$, $\Delta Vb'$ and $\Delta Vc'$ is substantially equal to the potential difference ΔV' between the electrode 5 and the P-type ZnSe layer 11 of the first embodiment shown in FIG. 14. Since the quantity of current flowing through the P-N junction structure between the electrodes 5 and 6 decreases exponentially with respect to the height of the energy barrier also in this case, the voltage necessary to obtain the current which causes the holes h to go over the energy barrier between the electrode 5 and the P-type ZnSe layer 11 can largely be reduced.

As described above, in this embodiment, like in the third embodiment, since the P-type interface film and the N-type super lattice layer 3 make it easy for the holes h and electrons e to go over the potential barriers, respectively, a lower voltage is required to operate the device.

Figure 20:
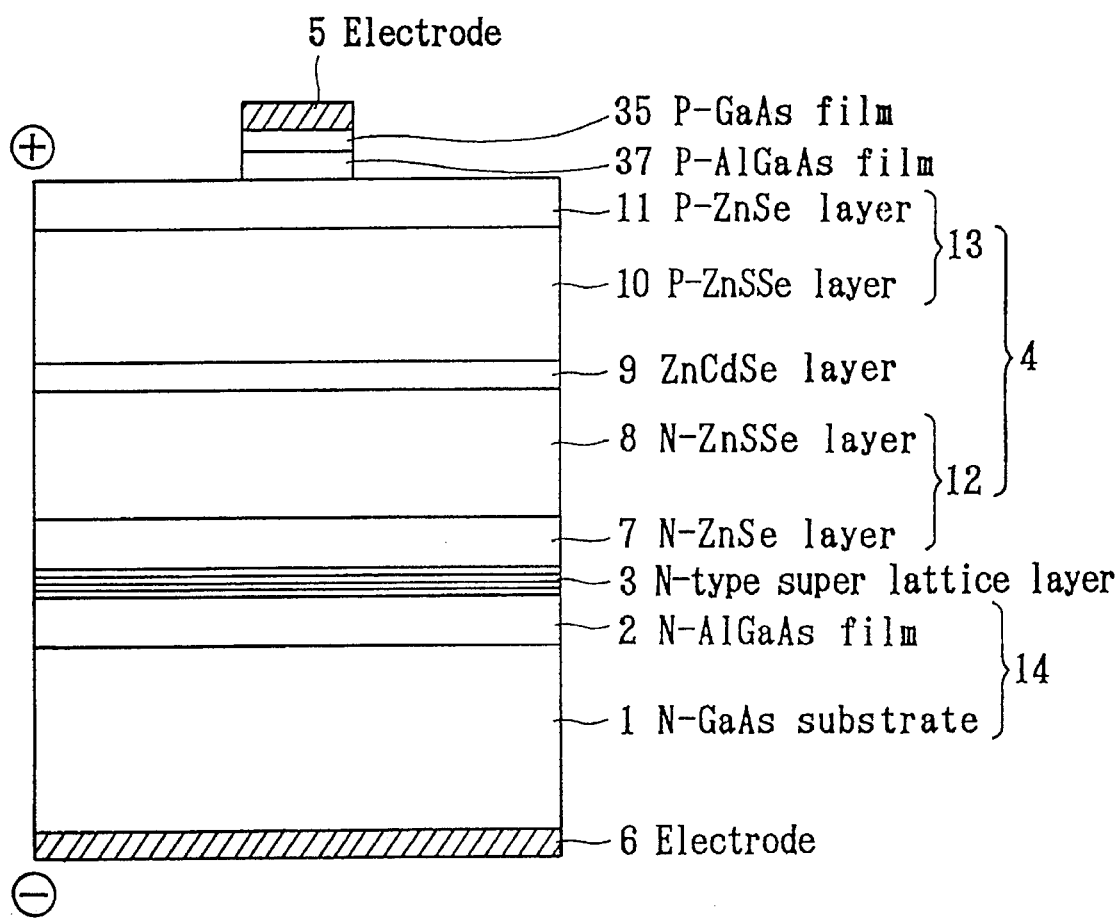
FIG. 20 is a cross-sectional view schematically showing the structure of a fifth embodiment of the present invention.
Figure 21:
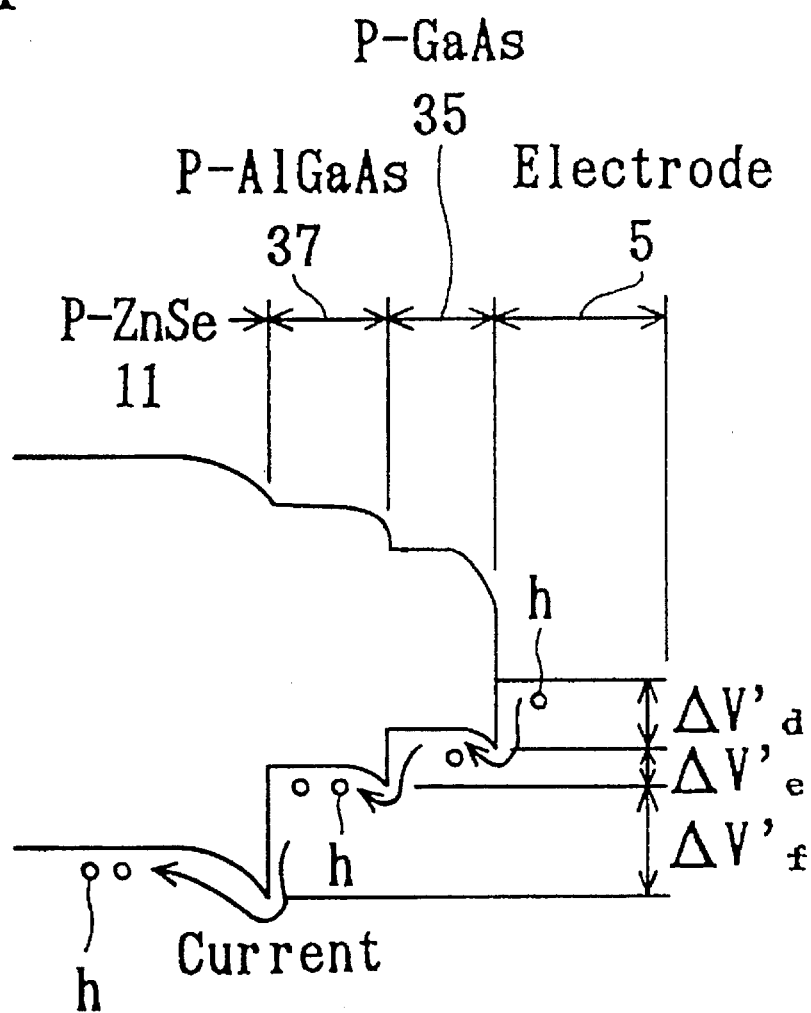
FIG. 21 schematically shows the manner in which holes go over the energy gap in the fifth embodiment.

FIGS. 20 and 21 show a fifth embodiment of the present invention. In this embodiment, portions having the same structures and workings as those of the first, third and fourth embodiments are identified by the same reference designations and are not described. In this embodiment, an MBE-grown P-type AlGaAs film 37 is formed on the P-type ZnSe layer 11 which is the top layer of the group II–VI semiconductor film 4, and the MBE-grown P-type GaAs film 35 is formed on the P-type AlGaAs layer 37. On the P-type GaAs film 35, a metal such as Au is deposited to form the electrode 5. Thus, the P-type interface film is of two-layer structure like in the fourth embodiment.

In the above-described structure, when a bias is applied between the electrode 5 and 6 in a forward direction, the current flows by way of the electrode 5, the P-type GaAs film 35 and the P-type GaAs film 37 into the group II–VI semiconductor film 4, and the current causes the holes h to go over the energy barrier between the electrode 5 and the group II–VI semiconductor film 4 to flow from the P-type semiconductor layer 13 into the ZnCdSe layer 9 which is an active layer.

FIG. 21 shows an energy band from the electrode 5 to the P-type ZnSe layer 11 in this embodiment. As show in this figure, the energy levels of the layers are higher in the order of the electrode 5<the P-type GaAs film 35<the P-type AlGaAs film 37<the P-type ZnSe layer 11. Therefore, the energy barrier from the electrode 5 to the P-type ZnSe layer 11 is divided into three steps, i.e. potential differences $\Delta Vd', \Delta Ve'$ and $\Delta Vf'$ since the P-type GaAs film 35 and the P-type AlGaAs film 37 are provided therebetween. As a result, the current flow easily like in the fourth embodiment.

The sum of $\Delta Vd', \Delta Ve'$ and $\Delta Vf'$ is substantially equal to the potential difference $\Delta V'$ between the electrode 5 and the P-type ZnSe layer 11 of the first embodiment shown in FIG. 14. Since the quantity of current flowing through the P-N junction structure between the electrodes 5 and 6 decreases exponentially with respect to the height of the energy barrier like in the third and fourth embodiments, the voltage necessary to obtain the current which causes the holes h to go over the energy barrier between the electrode 5 and the P-type ZnSe layer 11 can largely be reduced.

Therefore, also in this embodiment, not only the electrons e but also the holes h go over their potential barriers easily, and the device is operated at a lower voltage.

As described above, according to the present invention, in a light emitting device where a group II–VI semiconductor is grown on a group III–V semiconductor, by providing a super lattice layer between the group III–V semiconductor and the group II–VI semiconductor, the voltage/current characteristic is improved for the necessary current to flow at a lower voltage. As a result, the power consumption and the heat generation are effectively restrained to improve the temperature characteristic of the whole semiconductor light emitting device. Further, the deterioration speed of the device is restrained to prolong the life of the device.

In addition to this structure, in a structure where between the electrode and the P-type semiconductor layer which is the top layer of the group II–VI semiconductor film, a P-type interface film is formed having an energy band of a level intermediate between those of the P-type semiconductor layer and the electrode, the above-mentioned advantages are more remarkable.

Further, since the generation of heat while the device is operating is restrained, the distortion due to the difference in thermal expansion coefficient between the group II–V semiconductor and the group II–VI semiconductor is less likely caused.

Obviously, many modifications and variations of the present invention are possible in light of the above teachings. It is therefore to be understood that within the scope of the appended claims, the invention may be practiced other than as specifically described.

What is claimed is:

1. A semiconductor light emitting device comprising:
    a GaAs substrate;
    a group II–VI semiconductor film where an N-type semiconductor layer, an active layer and a P-type semiconductor layer are arranged in this order in lamination; and
    a ZnSe—AlGaAs super lattice layer made of ZnSe and AlGaAs both of which are of a same conductivity type as a conductivity type of the GaAs substrate, said super lattice layer being formed between the GaAs substrate and the group II–VI semiconductor film by alternatively forming the ZnSe and the AlGaAs in lamination while continuously varying a film thickness ratio so that a ZnSe film closer to the group II–VI semiconductor film is thicker and that an AlGaAs film closer to the GaAs substrate is thicker.

2. A semiconductor light emitting device according to claim 1, wherein said Group II–VI semiconductor film is made of a semiconductor of ZnCdSSe.

3. A semiconductor light emitting device according to claim 1, wherein said Group II–VI semiconductor film is made of a semiconductor of MgZnCdSSe.

4. A semiconductor light emitting device according to claim 1, wherein a Group III–V semiconductor film having a same conductivity type as the conductivity type of the GaAs substrate is formed between the GaAs substrate and the ZnSe—AlGaAs super lattice layer.

5. A semiconductor light emitting device according to claim 4, wherein said group III–V semiconductor film is an AlgaAs film.

6. A semiconductor light emitting device comprising:
    an N-type GaAs substrate;
    a group II–VI semiconductor film where an N-type semiconductor layer, an active layer and a P-type semiconductor layer are arranged in this order in lamination, the N-type semiconductor layer of said group II–VI semiconductor film being formed on a side of the N-type GaAs substrate;
    an N-type ZnSe—AlGaAs super lattice layer made of N-type ZnSe and N-type AlGaAs, said super lattice layer being formed between the N-type GaAs substrate and the N-type semiconductor layer of the group II–VI semiconductor film by alternately forming the N-type ZnSe and the N-type AlGaAs in lamination while continuously varying a film thickness ratio so that an N-type ZnSe film closer to the group II–VI semiconductor film is thicker and that an N-type AlGaAs film closer to the N-type GaAs substrate is thicker;
    a P-type interface film having an energy band lower than an energy band of the P-type semiconductor layer of the group II–VI semiconductor film, said P-type interface film being formed on the P-type semiconductor layer of the group II–VI semiconductor film; and
    an electrode formed on the P-type interface film.

7. A semiconductor light emitting device according to claim 6, wherein said group II–VI semiconductor film is made of a semiconductor of ZnCdSSe.

8. A semiconductor light emitting device according to claim 6, wherein said Group II–VI semiconductor film is made of a semiconductor of MgZnCdSSe.

9. A semiconductor light emitting device according to claim 6, wherein said P-type interface film is a P-type GaAs film.

10. A semiconductor light emitting device according to claim 6, wherein said P-type interface film is a P-type InGaAs film.

11. A semiconductor light emitting device according to claim 6, wherein said P-type interface film includes a P-type GaAs film and a P-type InGaAs film.

12. A semiconductor light emitting device according to claim 6, wherein said P-type interface film includes a P-type AlgaAs film and a P-type GaAs film.

13. A semiconductor light emitting device according to claim 6, wherein a Group III–V N-type semiconductor film is formed between the N-type GaAs substrate and the N-type ZnSe—AlgaAs super lattice layer.

14. A semiconductor light emitting device according to claim 13, wherein said Group III–V N-type semiconductor film is an AlGaAs film.

\* \* \* \* \*